US012727267B2

(12) United States Patent
Nakai et al.

(10) Patent No.: US 12,727,267 B2
(45) Date of Patent: Sep. 1, 2026

(54) SEMICONDUCTOR DEVICE

(71) Applicant: Oki Electric Industry Co., Ltd., Tokyo (JP)

(72) Inventors: Yusuke Nakai, Tokyo (JP); Takuma Ishikawa, Tokyo (JP); Kenichi Tanigawa, Tokyo (JP); Hiroto Kawada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 875 days.

(21) Appl. No.: 17/891,682

(22) Filed: Aug. 19, 2022

(65) Prior Publication Data

US 2023/0086071 A1 Mar. 23, 2023

(30) Foreign Application Priority Data

Sep. 17, 2021 (JP) ................................ 2021-152143

(51) Int. Cl.

| | |
|---|---|
| ***H10K 59/32*** | (2023.01) |
| ***H10F 39/00*** | (2025.01) |
| ***H10H 20/855*** | (2025.01) |
| ***H10H 29/14*** | (2025.01) |
| ***H10H 29/24*** | (2026.01) |

(Continued)

(52) U.S. Cl.
CPC ..... *H10F 39/8033* (2025.01); *H10F 39/8027* (2025.01); *H10F 39/806* (2025.01)

(58) Field of Classification Search
CPC .... H10H 29/34; H10H 29/855; H10H 20/855; H10H 29/14; H10H 29/24; H10K 59/32; H10K 59/353; H10K 50/85; H10K 50/855
See application file for complete search history.

(56) References Cited

U.S. PATENT DOCUMENTS

2007/0030676 A1* 2/2007 Ichihara .................... F21K 9/00 257/E33.059
2014/0203331 A1 7/2014 Tanaka
(Continued)

FOREIGN PATENT DOCUMENTS

| | | | |
|---|---|---|---|
| EP | 2161749 | A2 | 3/2010 |
| JP | 2010-062351 | A | 3/2010 |
| JP | 2014-153385 | A | 8/2014 |

(Continued)

OTHER PUBLICATIONS

Japanese Office Action dated Mar. 18, 2025, in the counterpart Japanese Patent Application No. 2021-152143.

*Primary Examiner* — Joshua Benitez Rosario
*Assistant Examiner* — John Lin
(74) *Attorney, Agent, or Firm* — Rabin & Berdo, P.C.

(57) ABSTRACT

A semiconductor device includes: a first layer including a first optical semiconductor element; a second layer including a second optical semiconductor element having a lower conversion efficiency than the first optical semiconductor element; and a lens member. The first optical semiconductor element and the second optical semiconductor element are disposed between the lens member and a focal point of the lens member in an optical axis direction of the lens member, at least partially overlap as viewed in the optical axis direction, and are disposed so that the second optical semiconductor element is closer to the focal point than the first optical semiconductor element.

9 Claims, 16 Drawing Sheets

(51) Int. Cl.

| | |
|---|---|
| ***H10H 29/855*** | (2025.01) |
| ***H10K 50/858*** | (2023.01) |

(56) References Cited

U.S. PATENT DOCUMENTS

| | | | | |
|---|---|---|---|---|
| 2016/0337625 | A1 | 11/2016 | Nakamura | |
| 2019/0165038 | A1 * | 5/2019 | Chae | H10H 20/8513 |

FOREIGN PATENT DOCUMENTS

| | | | |
|---|---|---|---|
| JP | 2016192467 | A | 11/2016 |
| JP | 2020166178 | A | 10/2020 |
| WO | 2020202766 | A1 | 10/2020 |
| WO | 2020218048 | A1 | 10/2020 |
| WO | 2020257680 | A1 | 12/2020 |

* cited by examiner

| D | E(ins) | E(15) | E(Lens) |
| --- | --- | --- | --- |
| 2/3 × d0 | 75.3% | 33.1% | 24.9% |
| d0 | 37.0% | 76.7% | 28.4% |
| f | 24.5% | 84.5% | 20.7% |

SEMICONDUCTOR DEVICE

BACKGROUND OF THE INVENTION

1. Field of the Invention

The present disclosure relates to a semiconductor device, and more particularly, to a structure of optical semiconductor elements and a lens in a micro light receiving or emitting device.

2. Description of the Related Art

In high-resolution micro-displays or high-resolution imaging devices having diagonal sizes less than 1 inch, there are demands for high brightness, high resolution, full color, and the like. To achieve high resolution, it has been proposed to use light emitting elements or light receiving elements of 100 μm or less. However, for example, in flip-chip mounting, which is a conventional light emitting diode (LED) mounting technique, it is difficult to mount micro-LEDs in a micro-display smaller than 1 inch with high accuracy. On the other hand, in forming a monolithic structure by wafer bonding, it is possible to perform processing with high accuracy, but it is difficult to achieve full color.

There has been proposed a technique of stacking thin-film LEDs to achieve full color (see, e.g., Japanese Patent Application Publication No. 2010-62351).

There also has been proposed an electro-optical device including multiple pixels each including a liquid crystal device that modulates irradiation light, and a microlens that condenses the irradiation light (see, e.g., Japanese Patent Application Publication No. 2014-153385).

SUMMARY OF THE INVENTION

An object of the present disclosure is to provide a novel semiconductor device with a lens member.

According to an aspect of the present disclosure, there is provided a semiconductor device including: a first layer including a first optical semiconductor element; a second layer including a second optical semiconductor element having a lower conversion efficiency than the first optical semiconductor element; and a lens member, wherein the first optical semiconductor element and the second optical semiconductor element are disposed between the lens member and a focal point of the lens member in an optical axis direction of the lens member, at least partially overlap as viewed in the optical axis direction, and are disposed so that the second optical semiconductor element is closer to the focal point than the first optical semiconductor element.

BRIEF DESCRIPTION OF THE DRAWINGS

In the attached drawings:

FIG. 3 is a cross-sectional view taken along line B-B of FIG. 1;

FIG. 5 is a diagram for explaining a microlens, a focal length f thereof, and the like;

FIG. 8 is a cross-sectional view taken along line B-B of FIG. 6;

FIG. 15A illustrates a total luminous flux L(All) in a state where a light emitting element is formed on a base insulating layer, FIG. 15B illustrates a luminous flux L(Lens-in) incident on a microlens from the light emitting element and a total luminous flux L(Lens-out) emitted from the microlens, and FIG. 15C illustrates a luminous flux L(Lens15) emitted into a solid angle having a half apex angle of 15°;

FIG. 16 is a table showing results of calculation of ratios E(ins), E(15), and E(Lens) for different values of a distance between the microlens and the light emitting element.

DETAILED DESCRIPTION OF THE INVENTION

First Embodiment

Figure 1:
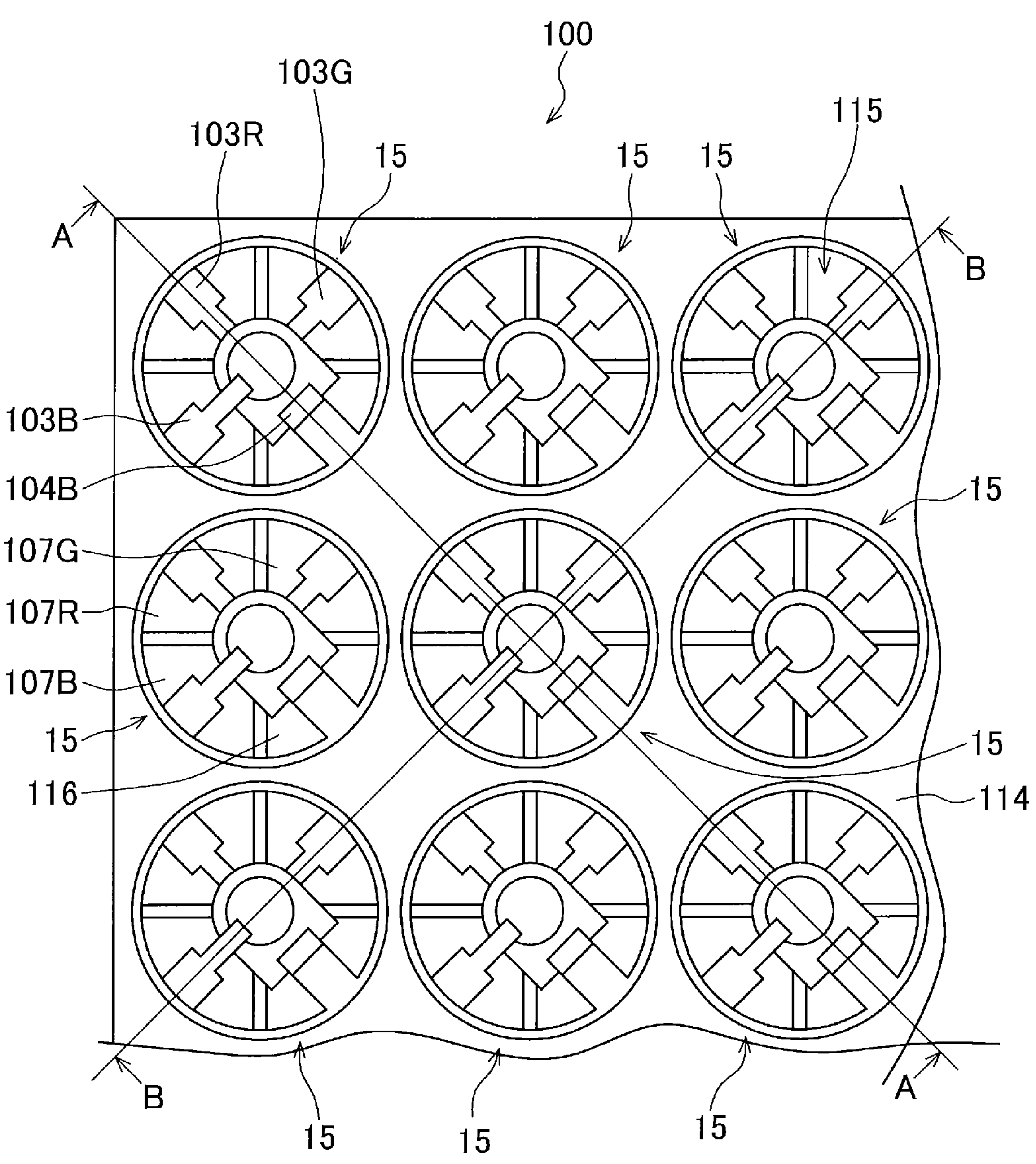
FIG. 1 is an enlarged plan view illustrating a part of a semiconductor device according to a first embodiment of the present disclosure.
Figure 2:
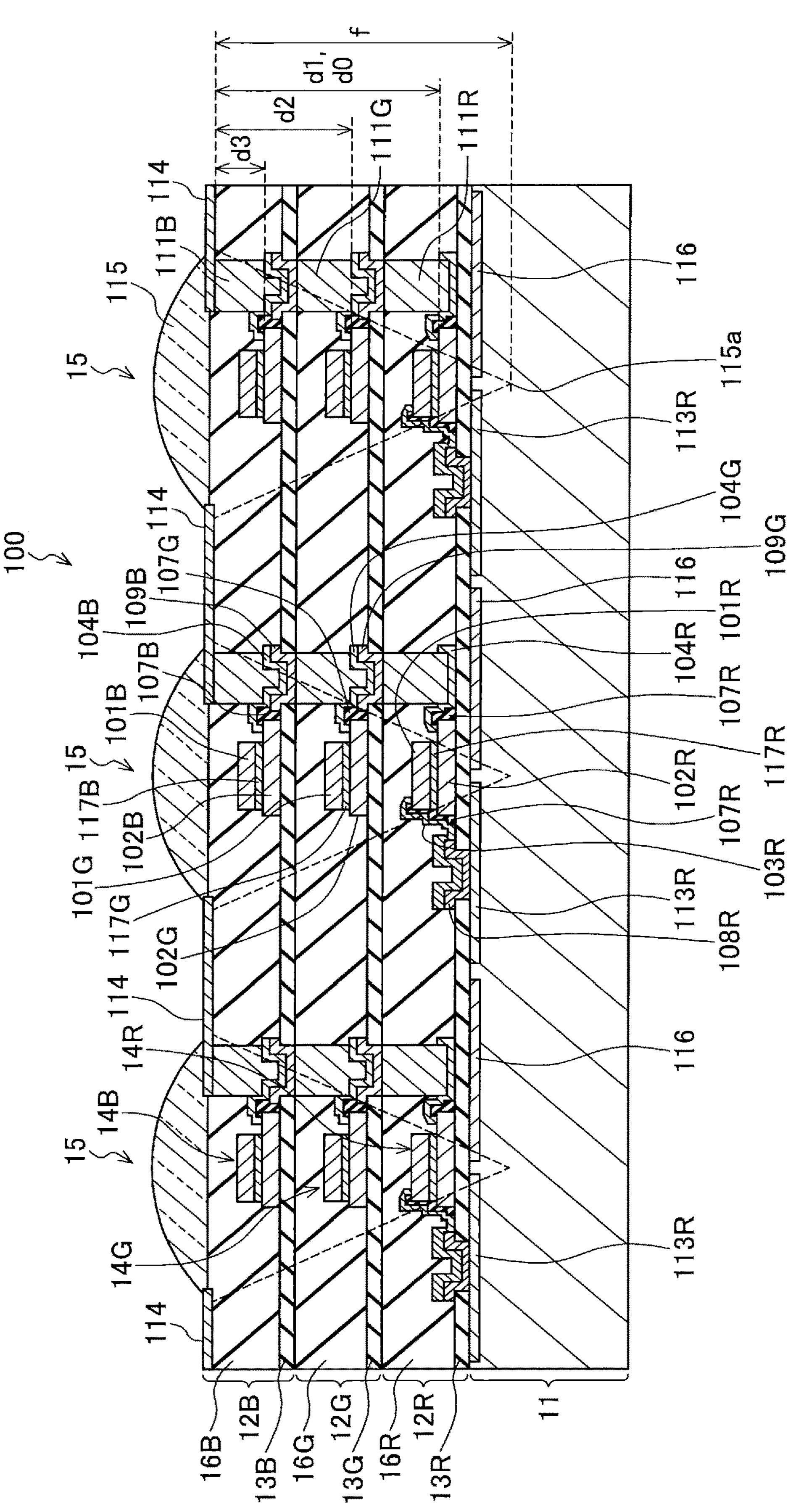
FIG. 2 is a cross-sectional view taken along line A-A of FIG. 1.
Figure 3:
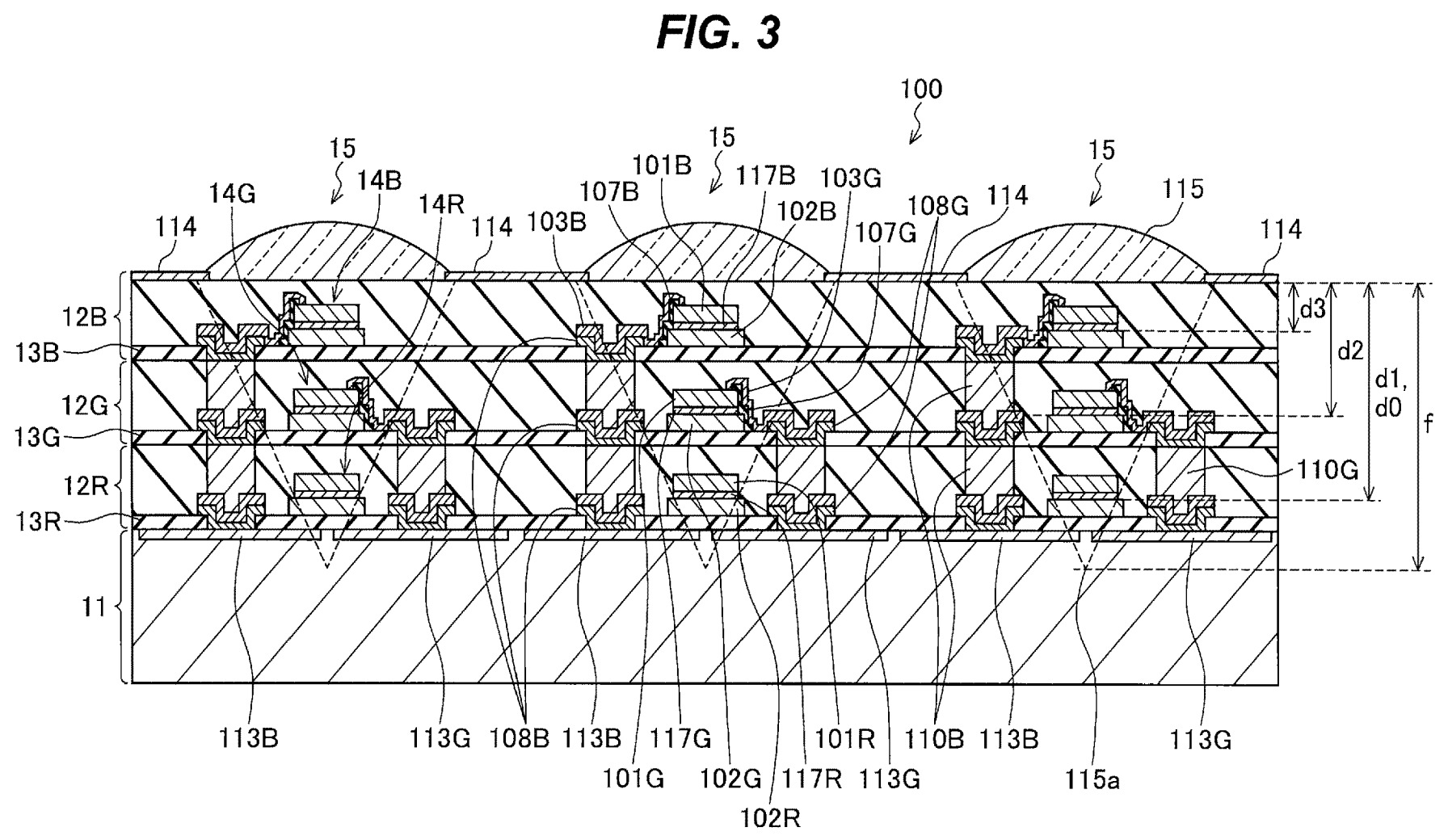

FIG. 1 is an enlarged plan view illustrating a part of a semiconductor device 100 according to a first embodiment of the present disclosure. FIG. 2 is a cross-sectional view taken along line A-A of FIG. 1. FIG. 3 is a cross-sectional view taken along line B-B of FIG. 1.

As illustrated in FIG. 1, the semiconductor device 100 includes multiple color light emitting units 15, which are formed adjacent to each other in a grid or matrix. As illustrated in the cross-sectional views of FIGS. 2 and 3, each color light emitting unit 15 is a unit constituted by a red light emitting element 14R, a green light emitting element 14G, a blue light emitting element 14B, and a microlens 115. The semiconductor device 100 includes a driving circuit substrate 11, a red (R) layer 12R, a green (G) layer 12G, and a blue (B) layer 12B, which are stacked in this order from bottom to top. These layers are separated by base insulating layers 13R, 13G, and 13B. In each color light emitting unit 15, the red light emitting element 14R, green light emitting element 14G, and blue light emitting element 14B are respectively disposed on the base insulating layers 13R, 13G, and 13B such that they overlap as viewed from above.

Each of the base insulating layers 13R, 13G, and 13B is formed by an insulating material transparent to visible light.

The base insulating layers 13R, 13G, and 13B may be formed by the same material or different materials.

The color light emitting units 15 have the same configuration. In each color light emitting unit 15, the red light emitting element 14R formed in the red (R) layer 12R, the green light emitting element 14G formed in the green (G) layer 12G, and the blue light emitting element 14B formed in the blue (B) layer 12B have corresponding parts, which have substantially the same shapes, and thus are given the same reference numerals, and are distinguished from each other by suffixes R, G, and B added to the reference numerals. Similarly, elements having the same functions are given the same reference numerals and distinguished from each other by suffixes R, G, and B added to the reference numerals according to the colors of the light emitting elements corresponding to the elements. In the following description, when parts or elements need not be distinguished from each other, the suffixes R, G, and B may be omitted.

Hereinafter, the semiconductor device 100 will be described basically by focusing on one color light emitting unit 15.

The red light emitting element 14R, which serves as a second optical semiconductor element and is formed in the red layer 12R serving as a second layer, includes an anode layer 101R, a light emitting layer 117R, and a cathode layer 102R that are stacked on each other. Each layer is formed by a single layer or multiple layers formed by material(s) such as GaAs, AlGaInP, GaN, AlGaN, or InGaN. The red light emitting element 14R functions as an element that emits red light.

The green light emitting element 14G, which serves as a first optical semiconductor element and is formed in the green layer 12G serving as a first layer, includes an anode layer 101G, a light emitting layer 117G, and a cathode layer 102G that are stacked on each other. Each layer is formed by a single layer or multiple layers formed by material(s) such as GaN, AlGaN, or InGaN. The green light emitting element 14G functions as an element that emits green light.

The blue light emitting element 14B, which serves as a third optical semiconductor element and is formed in the blue layer 12B serving as a third layer, includes an anode layer 101B, a light emitting layer 117B, and a cathode layer 102B that are stacked on each other. Each layer is formed by a single layer or multiple layers formed by material(s) such as GaN, AlGaN, or InGaN. The blue light emitting element 14B functions as an element that emits blue light.

An anode electrode 103R is electrically connected to the anode layer 101R and an anode electrode pad 108R to be described later. An anode electrode 103G is electrically connected to the anode layer 101G and anode electrode pads 108G to be described later. An anode electrode 103B is electrically connected to the anode layer 101B and anode electrode pads 108B to be described later. Each anode electrode 103 is formed by a single layer or multiple layers formed by transparent conductive film(s) such as indium tin oxide (ITO) film(s), metal(s) such as Au, Al, Pt, or Ti, or alloy(s) thereof. A cathode electrode 104R is electrically connected to the cathode layer 102R. A cathode electrode 104G is electrically connected to the cathode layer 102G and a cathode electrode pad 109G to be described later. A cathode electrode 104B is electrically connected to the cathode layer 102B and a cathode electrode pad 109B to be described later. Each cathode electrode 104 is formed by a single layer or multiple layers formed by transparent conductive film(s) such as ITO film(s), metal(s) such as Au or Al, or alloy(s) thereof.

Interlayer insulating layers 16R, 16G, and 16B are formed so that the light emitting elements 14R, 14G, and 14B formed on the base insulating layers 13R, 13G, and 13B are embedded in the interlayer insulating layers 16R, 16G, and 16B, respectively. Each of the interlayer insulating layers 16R, 16G, and 16B is formed by an organic film or an inorganic film transparent to visible light. Insulating layers 107R, which are organic insulating films or inorganic insulating films, are formed between the anode electrode 103R and the anode layer 101R, light emitting layer 117R, and cathode layer 102R, and between the cathode electrode 104R and the anode layer 101R, light emitting layer 117R, and cathode layer 102R, and provide electric insulation therebetween. Insulating layers 107G, which are organic insulating films or inorganic insulating films, are formed between the anode electrode 103G and the anode layer 101G, light emitting layer 117G, and cathode layer 102G, and between the cathode electrode 104G and the anode layer 101G, light emitting layer 117G, and cathode layer 102G, and provide electric insulation therebetween. Insulating layers 107B, which are organic insulating films or inorganic insulating films, are formed between the anode electrode 103B and the anode layer 101B, light emitting layer 117B, and cathode layer 102B, and between the cathode electrode 104B and the anode layer 101B, light emitting layer 117B, and cathode layer 102B, and provide electric insulation therebetween.

In this embodiment, the anode electrode pads 108R, 108G, and 108B are formed to cover openings passing through the base insulating layers 13R, 13G, and 13B. A lower surface of each of the anode electrode pads 108 is formed in the same plane as a lower surface of the corresponding one of the base insulating layers 13. Each anode electrode pad 108 is formed by a single layer or multiple layers formed by metal(s) such as Au, Al, Pt, or Ti, or alloy(s) thereof. The anode electrode pad 108R is electrically connected to the anode electrode 103R and an anode pad 113R to be described later. The anode electrode pads 108G are electrically connected to the anode electrode 103G, an anode electrode pillar 110G to be described later, and an anode pad 113G to be described later. The anode electrode pads 108B are electrically connected to the anode electrode 103B, anode electrode pillars 110B to be described later, and an anode pad 113B to be described later. The lower surface of each anode electrode pad 108 may project from the lower surface of the corresponding base insulating layer 13.

In this embodiment, the cathode electrode pads 109G and 109B are formed to cover openings passing through the base insulating layers 13G and 13B, respectively. Lower surfaces of the cathode electrode pads 109G and 109B are formed in the same planes as lower surfaces of the base insulating layers 13G and 13B, respectively. Each of the cathode electrode pads 109G and 109B is formed by a single layer or multiple layers formed by metal(s) such as Au, Al, Pt, or Ti, or alloy(s) thereof. The cathode electrode pads 109G and 109B are electrically connected to the cathode electrodes 104 and cathode electrode pillars 111R, 111G, and 111B to be described later. The lower surfaces of the cathode electrode pads 109G and 109B may project from the lower surfaces of the base insulating layers 13G and 13B.

The anode electrode pillars 110G and 110B are formed on the anode electrode pads 108G and 108B. Upper surfaces of the anode electrode pillars 110G and 110B are formed in the same planes as upper surfaces of the interlayer insulating layers 16R and 16G. Each of the anode electrode pillars 110G and 110B is formed by a single layer or multiple layers formed by metal(s) such as Cu, Ni, or Ti. The anode electrode pillar 110G is electrically connected to the anode electrode 103G and anode pad 113G. The anode electrode pillars 110B are electrically connected to the anode electrode 103B and anode pad 113B. The cathode electrode pillars 111 are formed on the cathode electrodes 104. Upper surfaces of the cathode electrode pillars 111R, 111G, and 111B are formed in the same planes as upper surfaces of the interlayer insulating layers 16R, 16G, and 16B, respectively. Each of the cathode electrode pillars 111 is formed by a single layer or multiple layers formed by metal(s) such as Cu, Ni, or Ti. The cathode electrode pillars 111 are electrically connected to the cathode electrodes 104, a cathode pad (not illustrated), and a cathode common wiring 114 to be described later.

The driving circuit substrate 11, serving as a control substrate, is a Si or glass substrate on which a driving circuit for light emitting elements is formed by a known complementary metal oxide semiconductor (CMOS) technique or thin-film transistor (TFT) technique, and drives and controls light emission of the light emitting elements 14 of the color light emitting units 15. The anode pads 113R, 113G, and 113B are formed on a surface of the driving circuit substrate 11. The anode pad 113R is electrically connected to the light emitting element 14R through the anode electrode pad 108R. The anode pad 113G is electrically connected to the light emitting element 14G through the anode electrode pads 108G and anode electrode pillar 110G. The anode pad 113B is electrically connected to the light emitting element 14B through the anode electrode pads 108B and anode electrode pillars 110B. The driving circuit of the driving circuit substrate 11 supplies currents to the light emitting elements 14. A dummy pad 116 is formed at a position corresponding to the cathode electrode pillars 111, in the driving circuit substrate 11.

The cathode common wiring 114 is formed by a single layer or multiple layers formed by metal(s) such as Au, Al, or Ti, or alloy(s) thereof. The cathode common wiring 114 is electrically connected to all the cathode layers 102 of the color light emitting units 15 in the semiconductor device 100 through the cathode electrode pillars 111, cathode electrodes 104, and cathode electrode pads 109, and electrically connected to the cathode pad (not illustrated) disposed on the driving circuit substrate 11.

Although in the above example, the cathode common wiring 114 is connected to the cathode pad (not illustrated) on the driving circuit substrate 11, the cathode pad need not necessarily be located on the driving circuit substrate 11. It is possible that a cathode pad is provided on another circuit substrate and connected to the cathode common wiring 114 by, for example, a known wire bonding technique. It is also possible that the dummy pads 116 are configured to serve as cathode pads, cathode electrode pads (not illustrated) are formed in the base insulating layer 13R, and the dummy pads 116 are electrically connected to the light emitting elements 14 through the cathode electrode pads (not illustrated).

As above, in each color light emitting unit 15, paths that allow currents to flow through the red light emitting element 14R, green light emitting element 14G, and blue light emitting element 14B are formed. Thus, it is possible to cause the red light emitting element 14R, green light emitting element 14G, and blue light emitting element 14B to individually emit light by causing predetermined currents to flow between the anode pads 113R, 113G, and 113B and the cathode pad.

The red light emitting element 14R emits light longer in wavelength than the green light emitting element 14G and blue light emitting element 14B. The green light emitting element 14G emits light longer in wavelength than the blue light emitting element 14B. For example, the wavelength of light emitted by the red light emitting element 14R is 601 to 780 nm, the wavelength of light emitted by the green light emitting element 14G is 491 to 600 nm, and the wavelength of light emitted by the blue light emitting element 14B is 400 to 490 nm.

The light emitting elements 14R, 14G, and 14B have different luminous efficiencies. The luminous efficiency refers to a ratio of the total luminous flux (lm) emitted from the light source to the electric power (W) supplied to the light source. The luminous efficiencies of the light emitting elements 14R, 14G, and 14B have the relationship of R<G<B.

The microlens 115, serving as a lens member, is disposed on the interlayer insulating layer 16B and cathode common wiring 114. The microlens 115 is formed by an organic material or an inorganic material transparent to visible light. The microlens 115 has a focal length f determined by a radius of curvature and a refractive index of the microlens 115, refractive indexes of the respective materials of the interlayer insulating layers 16 and base insulating layers 13, and the like, as described later.

Figure 4:
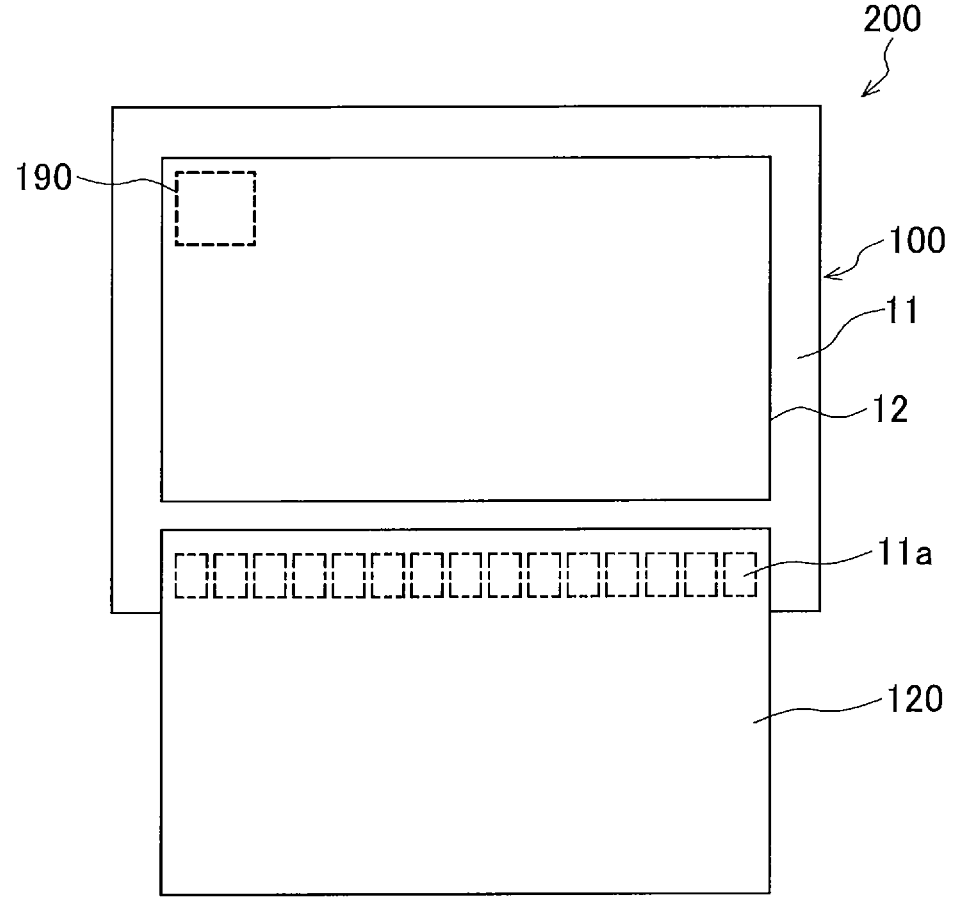
FIG. 4 is a schematic plan view illustrating a display module using the semiconductor device of the first embodiment.

FIG. 4 is a schematic plan view illustrating a display module 200 using the semiconductor device 100.

As illustrated in FIG. 4, the display module 200 includes the semiconductor device 100, connection pads 11*a* formed on an upper surface of the driving circuit substrate 11 of the semiconductor device 100, and a flexible printed circuit board (or flexible substrate) 120 electrically connected to the connection pads 11*a* through an anisotropic conductive film (not illustrated) or the like. The plan view of FIG. 1 is a partial enlarged view of the region 190, which is a part of the semiconductor device 100, indicated by the dashed line in FIG. 4.

The flexible printed circuit board 120 is electrically connected to an external device that supplies a data signal for an image to be displayed by the semiconductor device 100, which here operates as a display, a power supply voltage for the semiconductor device 100, and the like. The data signal, power supply voltage, and the like are supplied to the semiconductor device 100 through the flexible printed circuit board 120.

Figure 5:
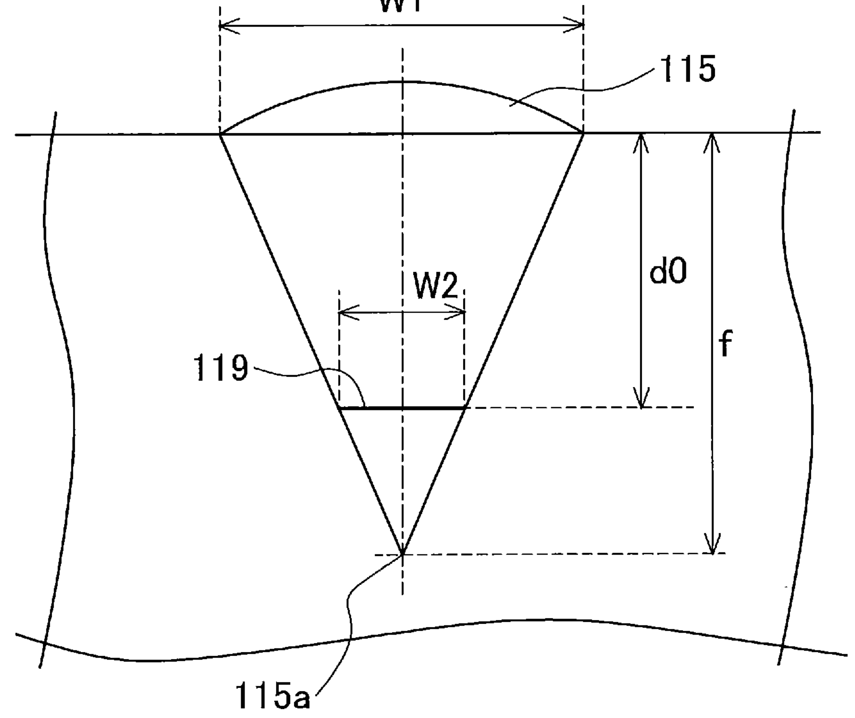

FIG. 5 is a diagram for explaining the microlens 115, the focal length f thereof, and the like. They will be described with reference to FIG. 5.

When it is assumed that the microlens 115 has a diameter W1, a light emitting element 14 is disposed so that a lower surface 119 of the light emitting layer 117 of the light emitting element 14 is perpendicular to an optical axis of the microlens 115 and a center of the lower surface 119 is located on the optical axis, the lower surface 119 of the light emitting layer 117 is formed in a region defined by a circle having a diameter W2 and has the diameter W2, the microlens 115 has the focal length f, and the lower surface 119 of the light emitting layer 117 is disposed to touch (or fit) an inner surface of a circular cone formed (or defined) by an outer circumference of the microlens 115 and a focal point 115*a* of the microlens 115, a distance (referred to below as an inscription distance) d0 from a lower surface of the microlens 115 to the lower surface 119 is determined by the following equation:

$$d0 = \left(1 - \frac{W2}{W1}\right) \times f. \tag{1}$$

When the interlayer insulating layers 16 and base insulating layers 13 have the same refractive index n2, the focal length f of the microlens 115 is determined by the following equation:

$$f = \frac{r \times n2}{n1 - 1}, \quad (2)$$

where r is the radius of curvature of the microlens 115, and n1 is the refractive index of the microlens 115. The microlens 115 is a spherical lens in this embodiment, but may be an aspherical lens.

Here, the refractive index n2 is a value at the wavelength of light emitted by the red light emitting element 14R, which has the lowest luminous efficiency of the red light emitting element 14R, green light emitting element 14G, and blue light emitting element 14B.

In general, a light collection efficiency of a lens is highest at a focal point of the lens. However, in a case where the difference between the diameter W1 of the microlens 115 and the diameter W2 of the lower surface 119 of the light emitting layer 117 of the light emitting element 14 is small as illustrated in FIG. 5, when the lower surface 119 is located at the focal point 115*a*, the light collection efficiency for light emitted from a center of the light emitting element 14 is high. However, light emitted from the region other than the center is incident on the microlens 115 and then refracted to spread outward when the light is emitted from the microlens 115. Thus, the light collection efficiency for light emitted from the entire light emitting element 14 is not sufficiently high.

By locating the lower surface 119 of the light emitting layer 117 of the light emitting element 14 at the inscription distance d0 from the microlens 115 as illustrated in FIG. 5, it is possible to increase a ratio of the light incident on the microlens 115 to the total light emitted from the entire light emitting element 14 and maximize the light collection efficiency for the total light emitted from the entire light emitting element 14.

To demonstrate the above, an optical simulation was performed by ray tracing, the results of which will be described with reference to FIGS. 15A to 15C.

Figure 15A:
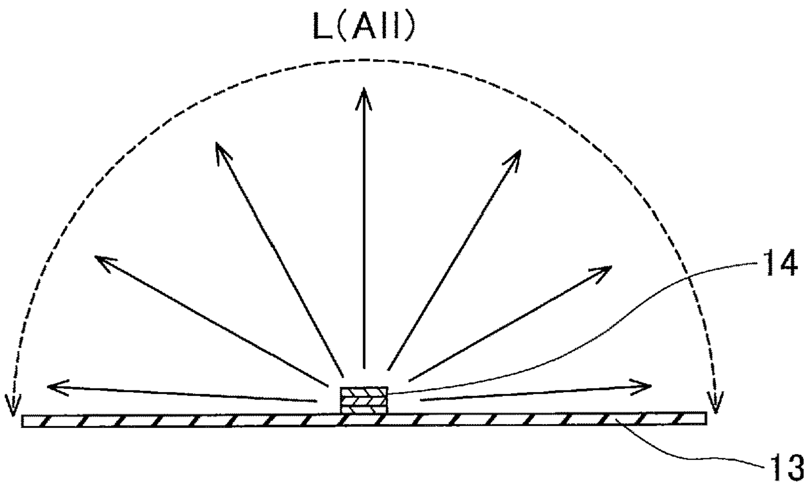
FIGS. 15A to 15C are diagrams for explaining an optical simulation performed by ray tracing.
Figure 15B:
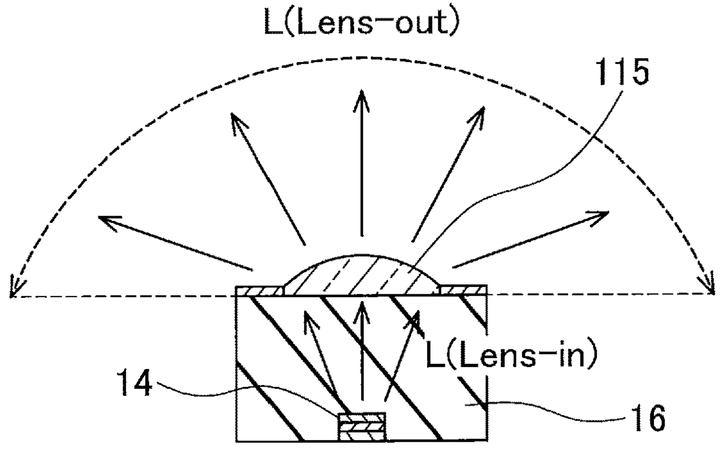
Figure 15C:
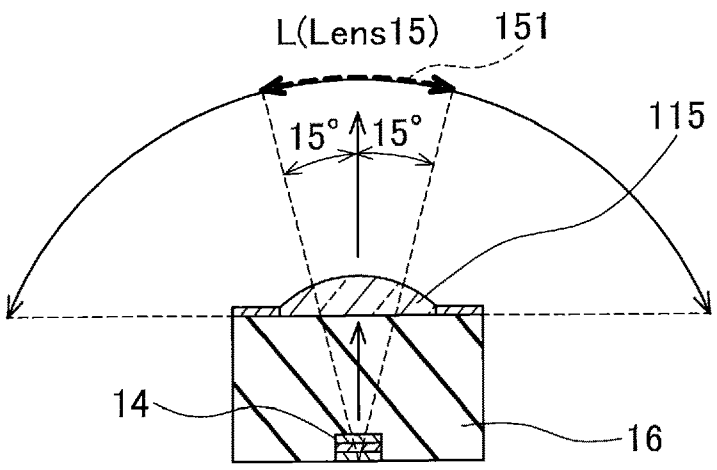

In the simulation, as illustrated in FIG. 15A, in a state where a light emitting element 14 is formed on a base insulating layer 13, the total luminous flux emitted from the light emitting element 14 is denoted by L(All). As illustrated in FIG. 15B, in a state where the light emitting element 14 is covered by an interlayer insulating layer 16 and a microlens 115 is formed on the interlayer insulating layer 16, the luminous flux incident on the microlens 115 from the light emitting element 14 is denoted by L(Lens-in), and the total luminous flux emitted from the microlens 115 is denoted by L(Lens-out). As illustrated in FIG. 15C, the luminous flux emitted from the microlens 115 into a solid angle 151 about the optical axis of the microlens 115 having a half apex angle of 15° and observed at infinity is denoted by L(Lens15).

An incidence efficiency E(ins) on the microlens 115 is defined by $$E(ins) = L(\text{Lens-in})/L(\text{All}).$$

A ratio E(15) of the luminous flux emitted into the solid angle 151 to the luminous flux incident on the microlens 115 is defined by $$E(15) = L(\text{Lens}15)/L(\text{Lens-in}).$$

A ratio E(Lens) of the luminous flux emitted into the solid angle 151 to the total luminous flux emitted from the light emitting element 14 is defined by $$E(\text{Lens}) = L(\text{Lens}15)/L(\text{All}) = E(ins) \times E(15).$$

The ratios E(ins), E(15), and E(Lens) were calculated for different values of the distance D between the microlens 115 and the light emitting element 14, the results of which are shown in FIG. 16.

Figure 17A:
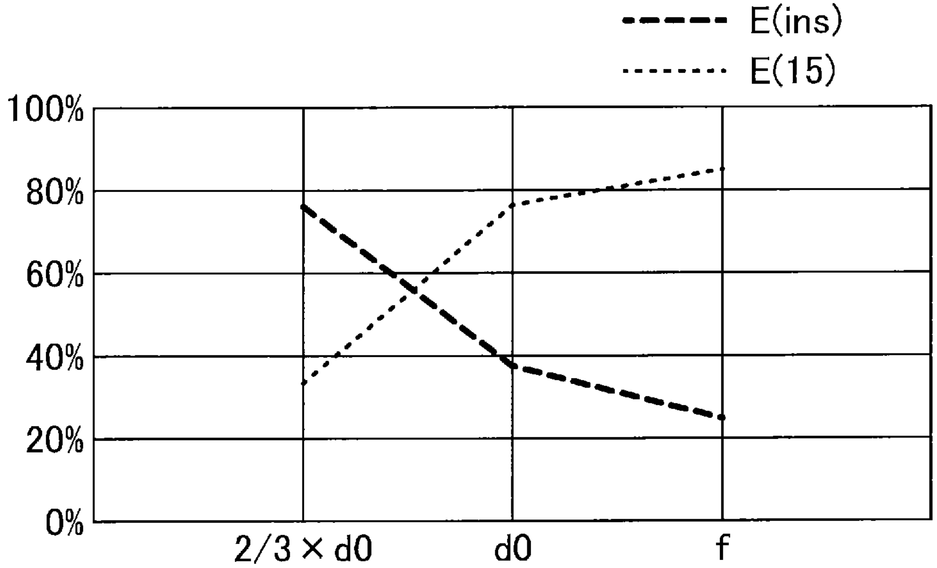
FIG. 17A is a graph plotting the relationship between the distance and the ratios E(ins) and E(15) from the results of FIG. 16.
Figure 17B:
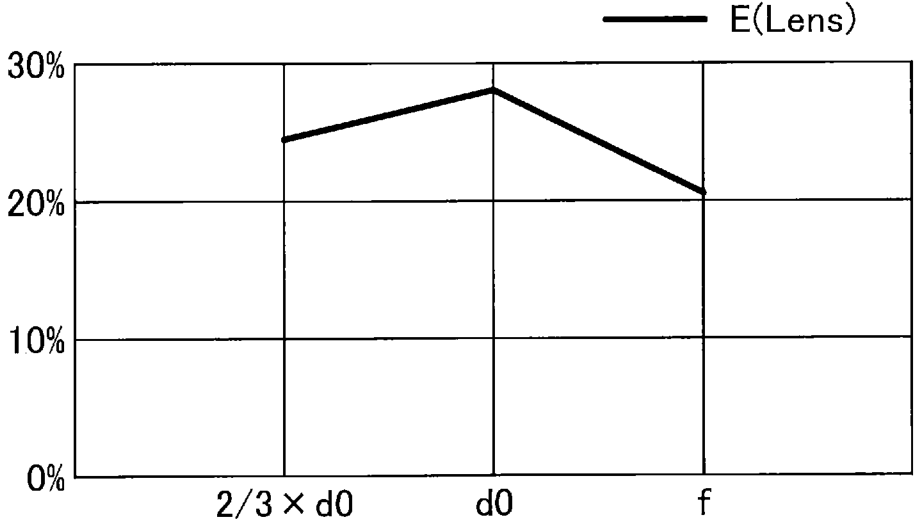
FIG. 17B is a graph plotting the relationship between the distance and the ratio E(Lens) from the results of FIG. 16.

FIG. 17A is a graph plotting the relationship between the distance D and the ratios E(ins) and E(15) from the results of FIG. 16. FIG. 17B is a graph plotting the relationship between the distance D and the ratio E(Lens) from the results of FIG. 16. These results show that the ratio E(ins) increases as the light emitting element 14 approaches the microlens 115, but the ratio E(15) increases as the light emitting element 14 approaches the focal point 115*a* of the microlens 115. Thus, the ratio E(Lens) is highest at a position displaced from the focal point 115*a* toward the microlens 115.

In the semiconductor device 100 of this embodiment, as illustrated in FIG. 2, the driving circuit substrate 11, red layer 12R, green layer 12G, and blue layer 12B are stacked in this order from bottom to top, each of the light emitting layers 117R, 117G, and 117B has a lower surface perpendicular to the optical axis of the microlens 115 and having a center on the optical axis of the microlens 115, and the lower surfaces of the light emitting layers 117R, 117G, and 117B are located at distances d1, d2, and d3 from the lower surface of the microlens 115, respectively.

On the basis of the above considerations, the focal length f of the microlens 115 is set so that the inscription distance d0 is closer to the distance d1 of the light emitting layer 117R of the red light emitting element 14R, which has the lowest luminous efficiency of the red light emitting element 14R, green light emitting element 14G, and blue light emitting element 14B, than to the other distances d2 and d3. Here, as illustrated in FIG. 2, the focal length f is set so that the inscription distance d0 is substantially equal to the distance d1 of the lower surface of the light emitting layer 117R from the lower surface of the microlens 115.

In this embodiment, the focal point 115*a* is displaced from an interface between the driving circuit substrate 11 and the red layer 12R in a direction away from the microlens 115. Specifically, the focal point 115*a* is located in the driving circuit substrate 11. However, this is not mandatory, and it is sufficient that the focal point 115*a* be displaced from the light emitting layer 117R in a direction away from the microlens 115.

Thus, the light collection efficiency of the microlens 115 is higher for the red light emitting element 14R than for the light emitting elements 14G and 14B, which are disposed at other positions, compensating for the low luminous efficiency of the red light emitting element 14R and compensating for the differences between the amounts of light emitted from the light emitting elements 14 of the respective colors.

In this embodiment, the driving circuit substrate 11, red layer 12R, green layer 12G, and blue layer 12B are stacked in this order from bottom to top. However, this is not mandatory, and they may be stacked in the order of the driving circuit substrate 11, red layer 12R, blue layer 12B, and green layer 12G from bottom to top.

As above, the semiconductor device 100 of this embodiment can compensate for the low luminous efficiency of the light emitting element 14R, which has the lowest luminous efficiency of the stacked multiple light emitting elements 14 having different luminous efficiencies, with the light collection efficiency of the microlens 115, compensating for the differences between the amounts of light emitted from the light emitting elements 14 of the respective colors. Thus, for example, the semiconductor device 100 can efficiently produce white light.

Although the focal length f has been described to be set so that the inscription distance d0 is substantially equal to the distance d1 of the lower surface of the light emitting layer 117R from the lower surface of the microlens 115, the present embodiment is not limited to this. It is sufficient that the red light emitting element 14R, green light emitting element 14G, and blue light emitting element 14B be disposed between the microlens 115 and the focal point (e.g., in a circular cone (represented by a dashed line in FIG. 2) defined by the focal point 115*a* and the outer circumference of the microlens 115) such that the red light emitting element 14R is closer to the focal point 115*a* than the light emitting elements 14G and 14B. Thereby, for example, compared to a case where the red light emitting element 14R is disposed farther from the focal point 115*a* than the light emitting element 14G or 14B, it is possible to compensate for the low luminous efficiency of the light emitting element 14R with the light collection efficiency of the microlens 115, compensating for the light amount differences between the light emitting elements 14 of the respective colors.

Although the differences between the luminous efficiencies of the light emitting elements can be compensated for by adjusting the currents flowing through the light emitting elements, this method complicates the control, which may increase the cost. For example, it is required to widen the range for adjusting the current flowing through a light emitting element having a low luminous efficiency.

Second Embodiment

Figure 6:
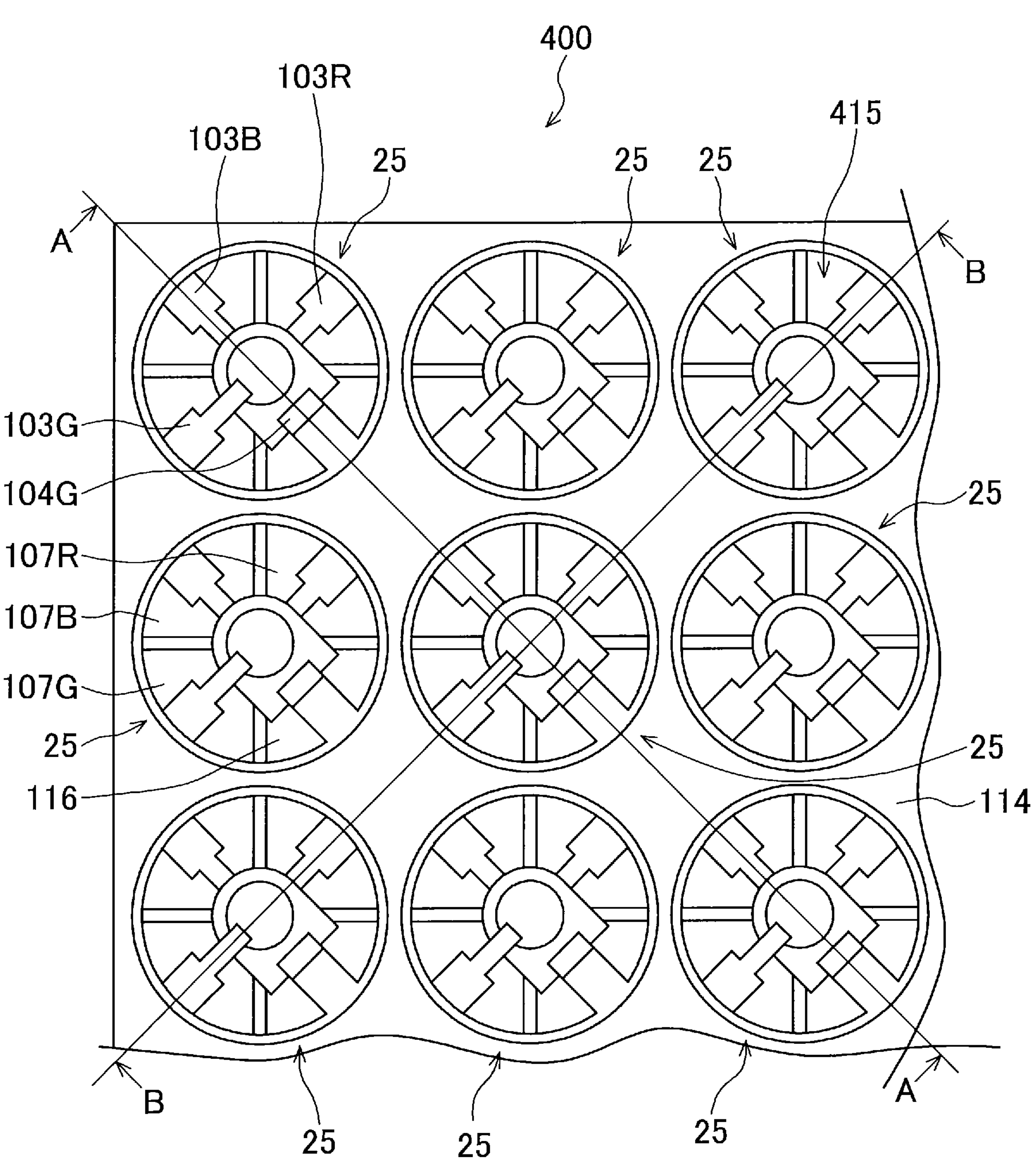
FIG. 6 is an enlarged plan view illustrating a part of a semiconductor device according to a second embodiment of the present disclosure.
Figure 7:
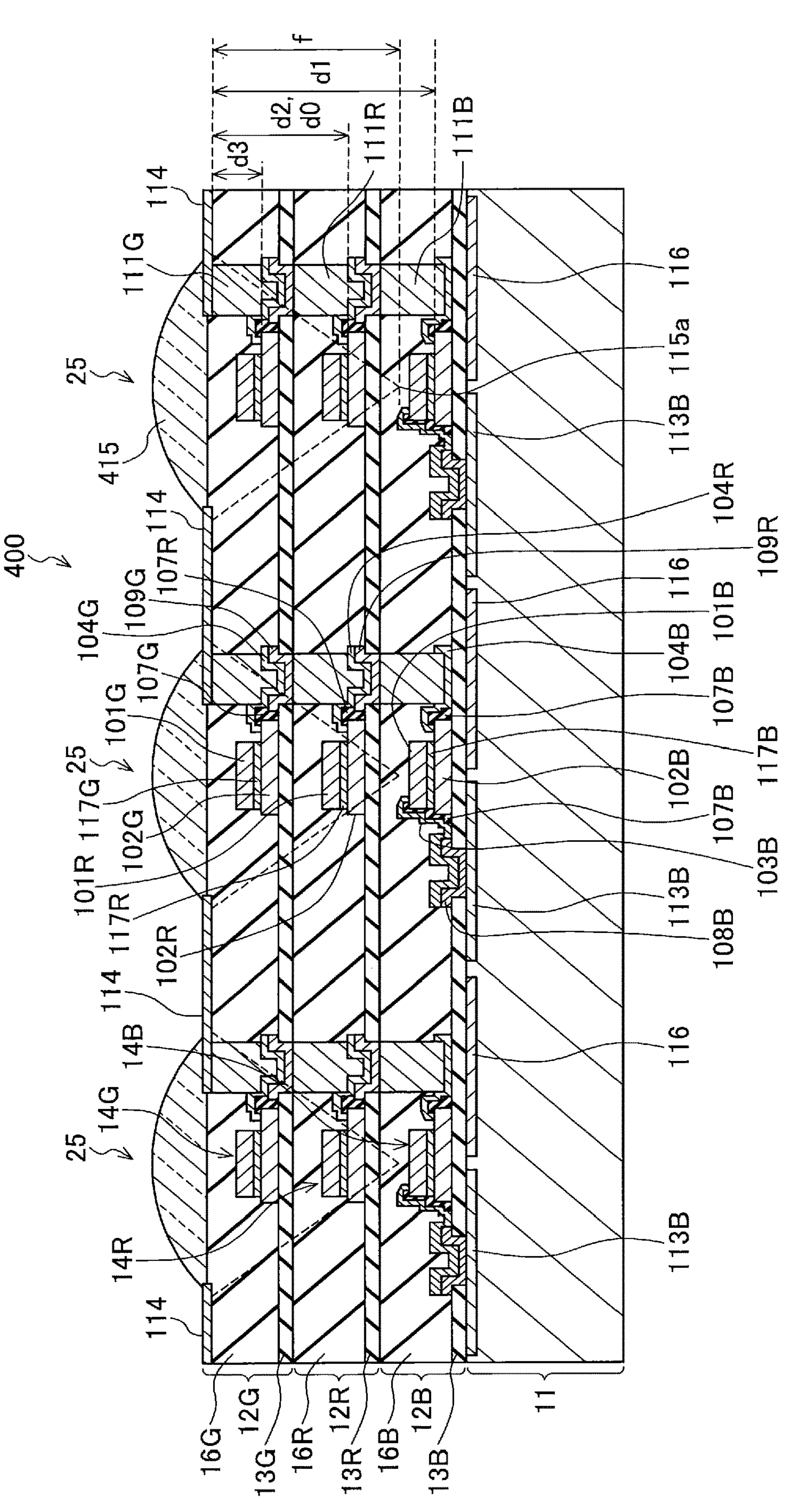
FIG. 7 is a cross-sectional view taken along line A-A of FIG. 6.
Figure 8:
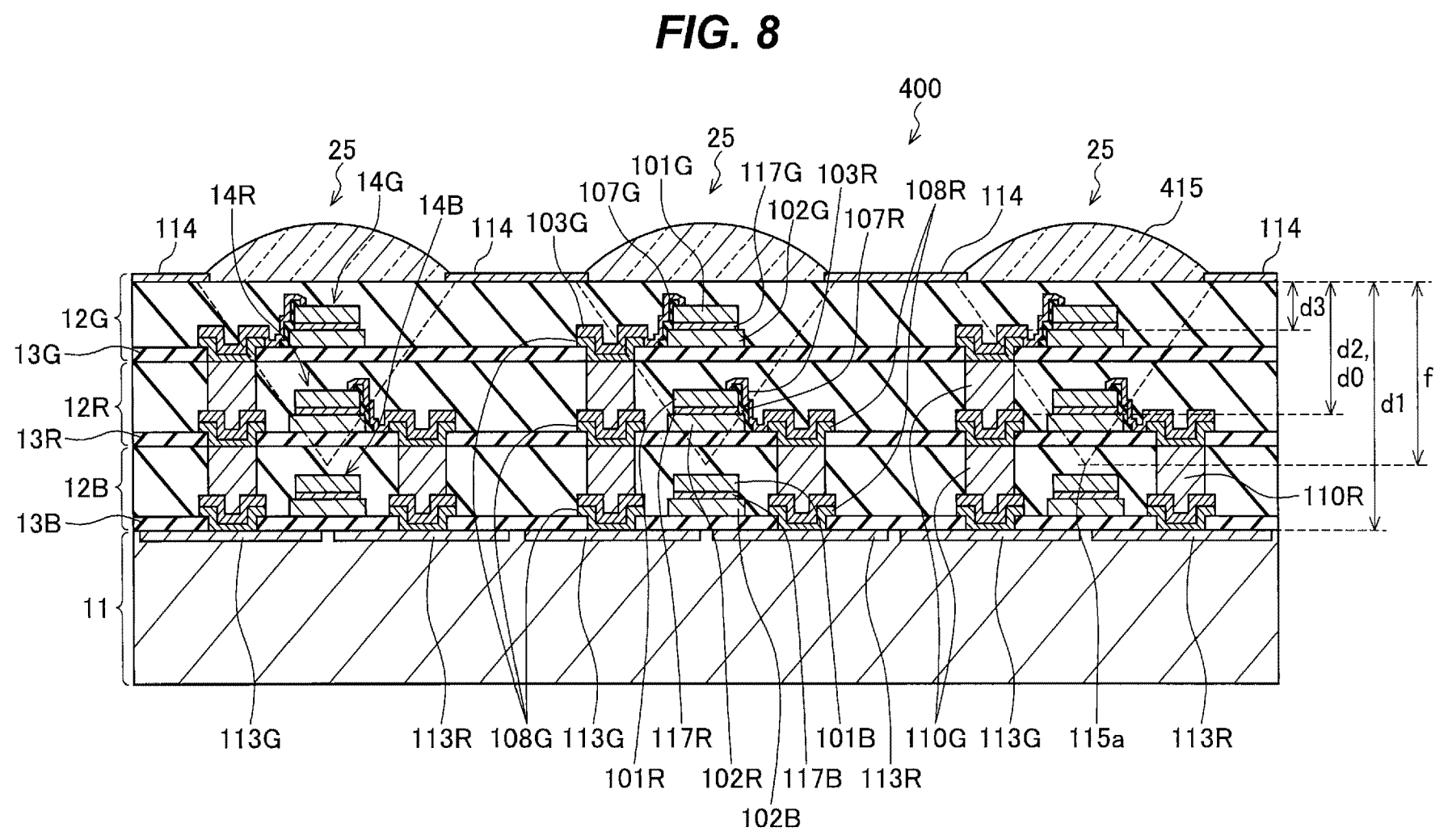

FIG. 6 is an enlarged plan view illustrating a part of a semiconductor device 400 according to a second embodiment of the present disclosure. FIG. 7 is a cross-sectional view taken along line A-A of FIG. 6. FIG. 8 is a cross-sectional view taken along line B-B of FIG. 6.

Parts of the semiconductor device 400 of this embodiment that are the same as those of the semiconductor device 100 of the first embodiment are given the same reference characters, and illustration and description thereof may be omitted. The configuration of the semiconductor device 400 is different from that of the semiconductor device 100 of the first embodiment illustrated in FIGS. 1, 2, and 3 mainly in that a driving circuit substrate 11, a blue (B) layer 12B, a red (R) layer 12R, and a green (G) layer 12G are stacked in this order from bottom to top. The following description focuses on the differences from the first embodiment.

As illustrated in FIG. 6, the semiconductor device 400 includes multiple color light emitting units 25 (corresponding to the color light emitting units 15 of FIG. 1), which are formed adjacent to each other in a grid or matrix. As illustrated in FIGS. 7 and 8, each color light emitting unit 25 is a unit constituted by a blue light emitting element 14B, a red light emitting element 14R, a green light emitting element 14G, and a microlens 415 serving as a lens member. As illustrated in FIGS. 7 and 8, the semiconductor device 400 of this embodiment has a configuration in which the driving circuit substrate 11, blue (B) layer 12B, red (R) layer 12R, and green (G) layer 12G are stacked in this order from bottom to top. These layers are separated by base insulating layers 13B, 13R, and 13G. In each color light emitting unit 25, the blue light emitting element 14B, red light emitting element 14R, and green light emitting element 14G are respectively disposed on the base insulating layers 13B, 13R, and 13G such that they overlap as viewed from above.

In the semiconductor device 400, lower surfaces of light emitting layers 117B, 117R, and 117G of the light emitting elements 14B, 14R, and 14G of the layers 12B, 12R, and 12G are located at distances d1, d2, and d3 from a lower surface of the microlens 415, respectively.

On the basis of the above considerations described with reference to FIG. 5, a focal length f of the microlens 415 is set so that the inscription distance d0 is closer to the distance d2 of the light emitting layer 117R of the red light emitting element 14R, which has the lowest luminous efficiency of the blue light emitting element 14B, red light emitting element 14R, and green light emitting element 14G, than to the other distances d1 and d3. Here, as illustrated in FIG. 7, the focal length f is set so that the inscription distance d0 is substantially equal to the distance d2 of the lower surface of the light emitting layer 117R from the lower surface of the microlens 415.

Thus, the light collection efficiency of the microlens 415 is higher for the red light emitting element 14R than for the light emitting elements 14G and 14B, which are disposed at other positions, compensating for the low luminous efficiency of the red light emitting element 14R and compensating for the differences between the amounts of light emitted from the light emitting elements 14 of the respective colors.

As above, the semiconductor device 400 of this embodiment can compensate for the low luminous efficiency of the light emitting element 14 having the lowest luminous efficiency of the stacked multiple light emitting elements 14 having different luminous efficiencies, with the light collection efficiency of the microlens 415, compensating for the differences between the amounts of light emitted from the light emitting elements 14 of the respective colors. Moreover, compared to the first embodiment, since the red light emitting element 14R having the lowest luminous efficiency is located close to the microlens 415, the incidence efficiency on the microlens 415 can be increased.

Although the focal length f has been described to be set so that the inscription distance d0 is substantially equal to the distance d2 of the lower surface of the light emitting layer 117R from the lower surface of the microlens 415, the present embodiment is not limited to this. It is sufficient that the red light emitting element 14R and green light emitting element 14G be disposed between the microlens 415 and a focal point 115*a* of the microlens 415 (e.g., in a circular cone (represented by a dashed line in FIG. 7) defined by the focal point 115*a* and an outer circumference of the microlens 415) such that the red light emitting element 14R is closer to the focal point 115*a* than the light emitting elements 14G. Thereby, for example, compared to a case where the red light emitting element 14R is disposed farther from the focal point 115*a* than the light emitting element 14G, it is possible to compensate for the low luminous efficiency of the light emitting element 14R with the light collection efficiency of the microlens 415, compensating for the light amount differences between the light emitting elements 14 of the respective colors.

For the blue light emitting element 14B, the incidence efficiency on the microlens 415 is low compared to the first embodiment. However, the luminous efficiency of the blue light emitting element 14B is higher than that of the red light emitting element 14R, and when red, green, and blue light are mixed together to produce white light, the percentage of the blue light is low. Thus, although the incidence efficiency of the blue light on the microlens 415 decreases, since the incidence efficiency of the red light on the microlens 415 increases to compensate for the decrease, white light can be efficiently produced.

Third Embodiment

Figure 9:
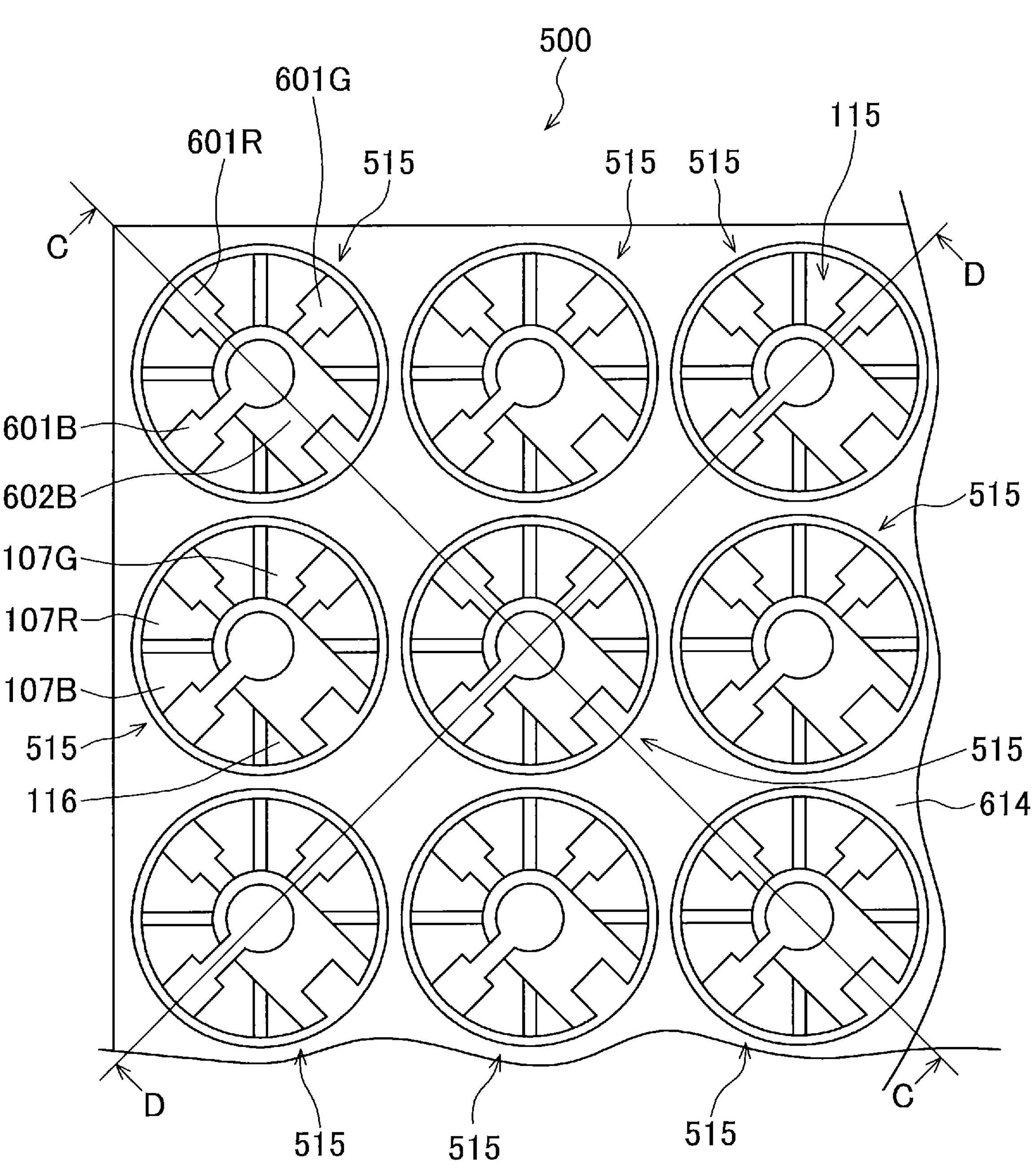
FIG. 9 is an enlarged plan view illustrating a part of a semiconductor device according to a third embodiment of the present disclosure.
Figure 10:
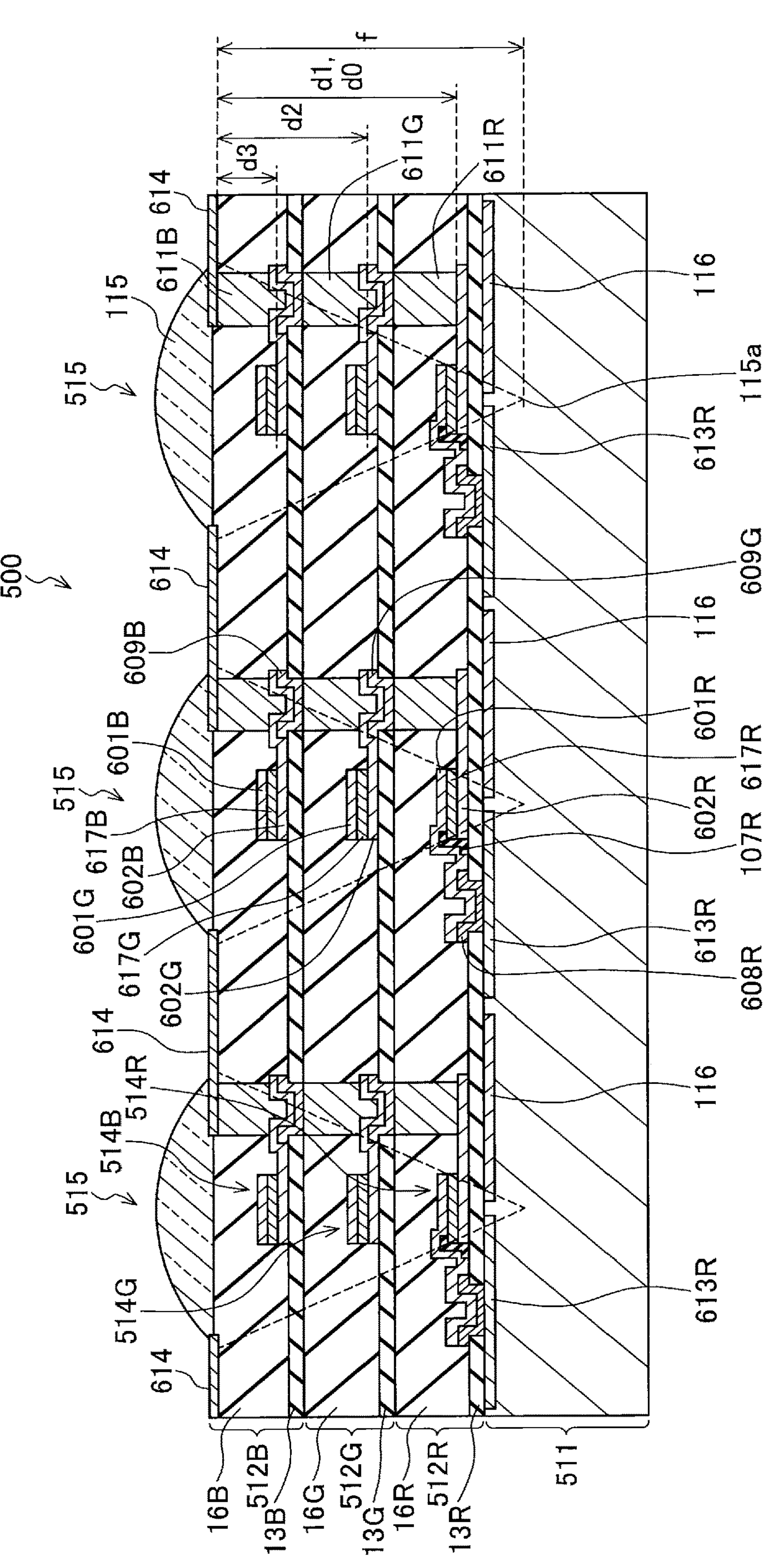
FIG. 10 is a cross-sectional view taken along line C-C of FIG. 9.
Figure 11:
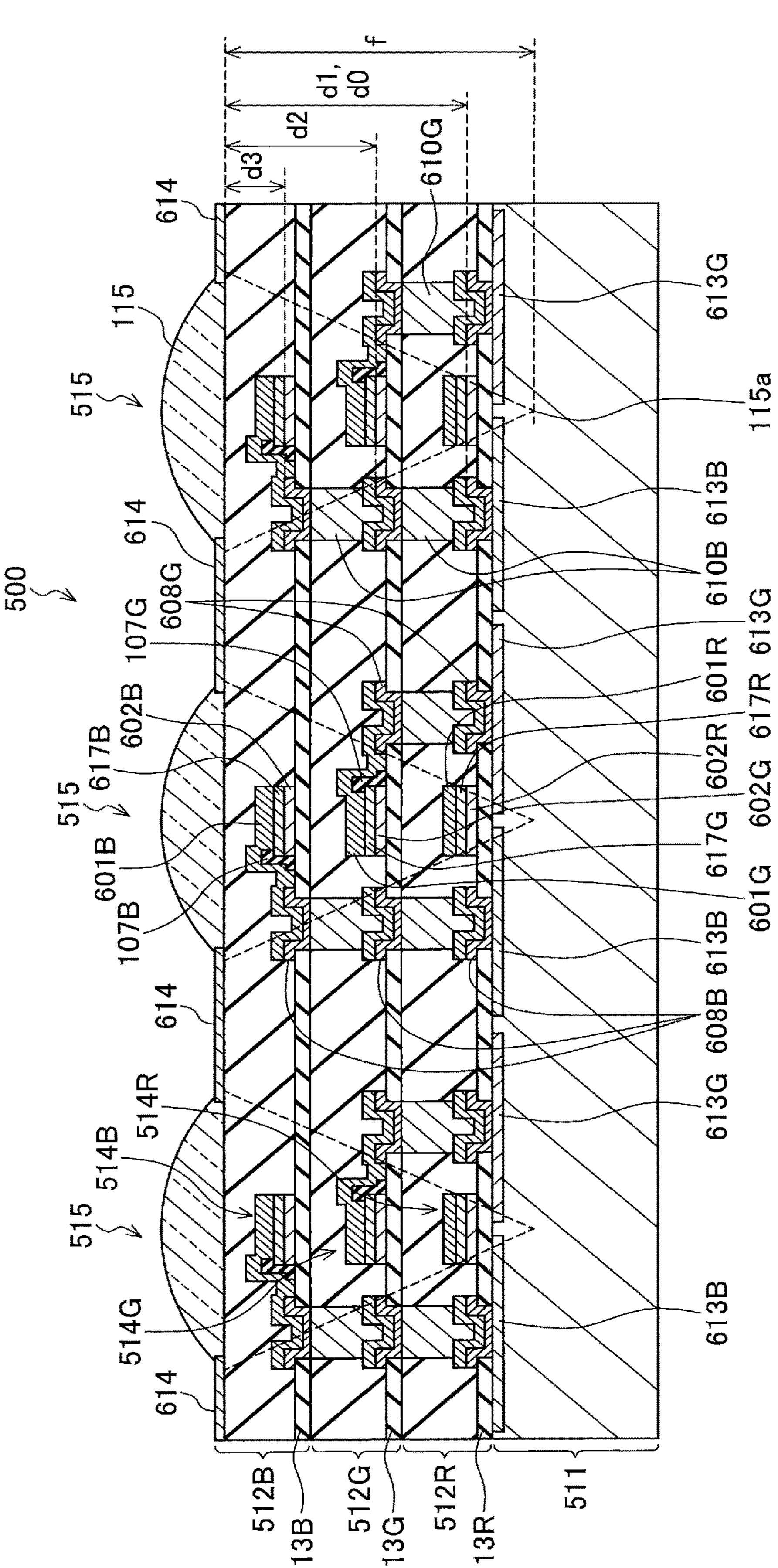
FIG. 11 is a cross-sectional view taken along line D-D of FIG. 9.

FIG. 9 is an enlarged plan view illustrating a part of a semiconductor device 500 according to a third embodiment of the present disclosure. FIG. 10 is a cross-sectional view taken along line C-C of FIG. 9. FIG. 11 is a cross-sectional view taken along line D-D of FIG. 9.

Parts of the semiconductor device 500 of this embodiment that are the same as those of the semiconductor device 100 of the first embodiment are given the same reference characters, and illustration and description thereof may be omitted. The configuration of the semiconductor device 500 is different from that of the semiconductor device 100 of the first embodiment illustrated in FIGS. 1 to 3 mainly in that light receiving elements (or photodetectors) are disposed instead of the light emitting elements 14. The following description focuses on the differences from the first embodiment.

As illustrated in FIG. 9, the semiconductor device 500 includes multiple color light receiving units 515, which are formed adjacent to each other in a grid or matrix. As illustrated in the cross-sectional views of FIGS. 10 and 11, each color light receiving unit 515 is a unit constituted by a red light receiving element 514R, a green light receiving element 514G, a blue light receiving element 514B, and a microlens 115. The semiconductor device 500 includes an individual electrode selection circuit substrate 511, a red (R) layer 512R, a green (G) layer 512G, and a blue (B) layer 512B, which are stacked in this order from bottom to top. These layers are separated by base insulating layers 13R, 13G, and 13B. In each color light receiving unit 515, the red light receiving element 514R, green light receiving element 514G, and blue light receiving element 514B are respectively disposed on the base insulating layers 13R, 13G, and 13B such that they overlap as viewed from above.

The color light receiving units 515 have the same configuration. In each color light receiving unit 515, the red light receiving element 514R formed in the red layer 512R, the green light receiving element 514G formed in the green layer 512G, and the blue light receiving element 514B formed in the blue layer 512B have corresponding parts, which have substantially the same shapes, and thus are given the same reference numerals, and are distinguished from each other by suffixes R, G, and B added to the reference numerals. Similarly, elements having the same functions are given the same reference numerals and distinguished from each other by suffixes R, G, and B added to the reference numerals according to the colors of the light receiving elements corresponding to the elements. In the following description, when parts or elements need not be distinguished from each other, the suffixes R, G, and B may be omitted.

Hereinafter, the semiconductor device 500 will be described basically by focusing on one color light receiving unit 515.

The red light receiving element 514R, which serves as a second optical semiconductor element and is formed in the red layer 512R serving as a second layer, includes an individual electrode 601R, a photoelectric conversion element 617R, and a common electrode 602R, which are stacked on each other.

The red light receiving element 514R functions as an element that receives red light. The green light receiving element 514G, which serves as a first optical semiconductor element and is formed in the green layer 512G serving as a first layer, includes an individual electrode 601G, a photoelectric conversion element 617G, and a common electrode 602G, which are stacked on each other. The green light receiving element 514G functions as an element that receives green light. The blue light receiving element 514B, which serves as a third optical semiconductor element and is formed in the blue layer 512B serving as a third layer, includes an individual electrode 601B, a photoelectric conversion element 617B, and a common electrode 602B, which are stacked on each other. The blue light receiving element 514B functions as an element that receives blue light.

Each photoelectric conversion element 617 is formed by organic semiconductor, and absorbs light of specific wavelengths to generate electron-hole pairs. For example, the photoelectric conversion element 617R selectively absorbs red light, the photoelectric conversion element 617G selectively absorbs green light, and the photoelectric conversion element 617B selectively absorbs blue light. The individual electrodes 601R, 601G, and 601B, and common electrodes 602R, 602G, and 602B are formed by, for example, transparent conductive films such as ITO films. The individual electrodes 601 and common electrodes 602 sandwich the photoelectric conversion elements 617 and take charges generated by the photoelectric conversion elements 617. Interlayer insulating layers 16R, 16G, and 16B are formed so that the light receiving elements 514R, 514G, and 514B formed on the base insulating layers 13R, 13G, and 13B are embedded in the interlayer insulating layers 16R, 16G, and 16B, respectively.

An individual electrode pad 608R is electrically connected to the individual electrode 601R. Individual electrode pads 608G are electrically connected to the individual electrode 601G and an individual electrode pillar 610G to be described later. Individual electrode pads 608B are electrically connected to the individual electrode 601B and individual electrode pillars 610B to be described later. Common electrode pads 609G and 609B are electrically connected to the common electrodes 602R, 602G, and 602B and common electrode pillars 611R, 611G, and 611B to be described later. Each of the individual electrode pads 608 and common electrode pads 609 is formed by a single layer or multiple layers formed by transparent conductive film(s) such as ITO film(s), metal(s) such as Au or Al, or alloy(s) thereof. The individual electrode pillar 610G electrically connects between the individual electrode pads 608G above and below the individual electrode pillar 610G. Each individual electrode pillar 610B electrically connects between two of the individual electrode pads 608B above and below the individual electrode pillar 610B. The common electrode pillar 611R electrically connects between the common electrode pad 609G and the common electrode 602R above and below the common electrode pillar 611R. The common electrode pillar 611G electrically connects between the common electrode pads 609B and 609G above and below the common electrode pillar 611G. The common electrode pillar 611B electrically connects between a common electrode wiring 614 to be described later and the common electrode pad 609B above and below the common electrode pillar 611B. Each of the individual electrode pillars 610G and 610B and common electrode pillars 611R, 611G, and 611B is formed by a single layer or multiple layers formed by metal(s) such as Cu, Ni, or Ti.

The individual electrode selection circuit substrate 511, serving as a control substrate, is a Si or glass substrate on which an individual electrode selection circuit is formed by a known CMOS technique or TFT technique, and takes a signal from a selected light receiving element 514 (corresponding to a pixel). Individual pads 613R, 613G, and 613B are formed on a surface of the individual electrode selection circuit substrate 511. The individual pad 613R is electrically connected to the light receiving element 514R through the individual electrode pad 608R. The individual pad 613G is electrically connected to the light receiving element 514G through the individual electrode pads 608G and individual electrode pillar 610G. The individual pad 613B is electrically connected to the light receiving element 514B through the individual electrode pads 608B and individual electrode pillars 610B. The individual pads 613R, 613G, and 613B transmit signals from the light receiving elements 514R, 514G, and 514B to the individual electrode selection circuit of the individual electrode selection circuit substrate 511, respectively. A dummy pad 116 is formed at a position corresponding to the common electrode pillars 611, in the individual electrode selection circuit substrate 511.

The common electrode wiring 614 is formed by a single layer or multiple layers formed by metal(s) such as Au or Al, or alloy(s) thereof. The common electrode wiring 614 is electrically connected to all the common electrodes 602 of the color light receiving units 515 in the semiconductor device 500 through the common electrode pillars 611 and common electrode pads 609, and electrically connected to a common electrode connection pad (not illustrated) disposed on the individual electrode selection circuit substrate 511.

The microlens 115 is disposed on the interlayer insulating layer 16B and common electrode wiring 614. The microlens 115 is formed by an organic material or an inorganic material transparent to visible light. The microlens 115 has a focal length f determined by a radius of curvature and a refractive index of the microlens 115, refractive indexes of the respective materials of the interlayer insulating layers 16 and base insulating layers 13, and the like. As with the first embodiment, the focal length f is determined by equation (2).

In this embodiment, the photoelectric conversion elements 617R, 617G, and 617B have different photoelectric conversion efficiencies, which have the relationship of R<G<B. As illustrated in FIG. 10, each of the photoelectric conversion elements 617R, 617G, and 617B has a lower surface perpendicular to the optical axis of the microlens 115 and having a center on the optical axis of the microlens 115, and the lower surfaces of the photoelectric conversion elements 617R, 617G, and 617B are located at distances d1, d2, and d3 from the lower surface of the microlens 115, respectively. When it is assumed that the microlens 115 has a diameter W1, the lower surface of a photoelectric conversion element 617 is formed in a region defined by a circle having a diameter W2 and has the diameter W2, the microlens 115 has the focal length f, and the lower surface of the photoelectric conversion element 617 touches (or fits) an inner surface of a circular cone formed (or defined) by an outer circumference of the microlens 115 and a focal point 115*a* of the microlens 115 (or when it is assumed that in FIG. 5, the lower surface of a photoelectric conversion element 617 is disposed instead of the lower surface 119 of the light emitting layer 117 and has a diameter W2), a distance (referred to below as an inscription distance) d0 from a lower surface of the microlens 115 to the lower surface of the photoelectric conversion element 617 is determined by equation (1). The inscription distance d0 is shown in FIGS. 10 and 11.

On the basis of the above considerations described with reference to FIG. 5, the focal length f of the microlens 115 is set so that the inscription distance d0 is closer to the distance d1 of the photoelectric conversion element 617R of the red light receiving element 514R, which has the lowest photoelectric conversion efficiency of the red light receiving element 514R, green light receiving element 514G, and blue light receiving element 514B, than to the other distances d2 and d3. Here, as illustrated in FIG. 10, the focal length f is set so that the inscription distance d0 is substantially equal to the distance d1 of the lower surface of the photoelectric conversion element 617R from the lower surface of the microlens 115.

Thus, the light collection efficiency of the microlens 115 is higher for the red light receiving element 514R than for the light receiving elements 514G and 514B, which are disposed at other positions, compensating for the low photoelectric conversion efficiency of the red light receiving element 514R.

Although the focal length f has been described to be set so that the inscription distance d0 is substantially equal to the distance d1 of the lower surface of the red light receiving element 514R from the lower surface of the microlens 115, the present embodiment is not limited to this. It is sufficient that the red light receiving element 514R serving as a second optical semiconductor element, the green light receiving element 514G serving as a first optical semiconductor element, and the blue light receiving element 514B be disposed between the microlens 115 and the focal point such that the red light receiving element 514R is closer to the focal point 115*a* than the green light receiving element 514G and blue light receiving element 514B. Thereby, for example, compared to a case where the red light receiving element 514R is disposed farther from the focal point 115*a* than the green light receiving element 514G and blue light receiving element 514B, it is possible to compensate for the low photoelectric conversion efficiency of the red light receiving element 514R with the light collection efficiency of the microlens 115, compensating for the differences between the photoelectric conversion efficiencies of the light receiving elements 514 of the respective colors.

Modification

Figure 12:
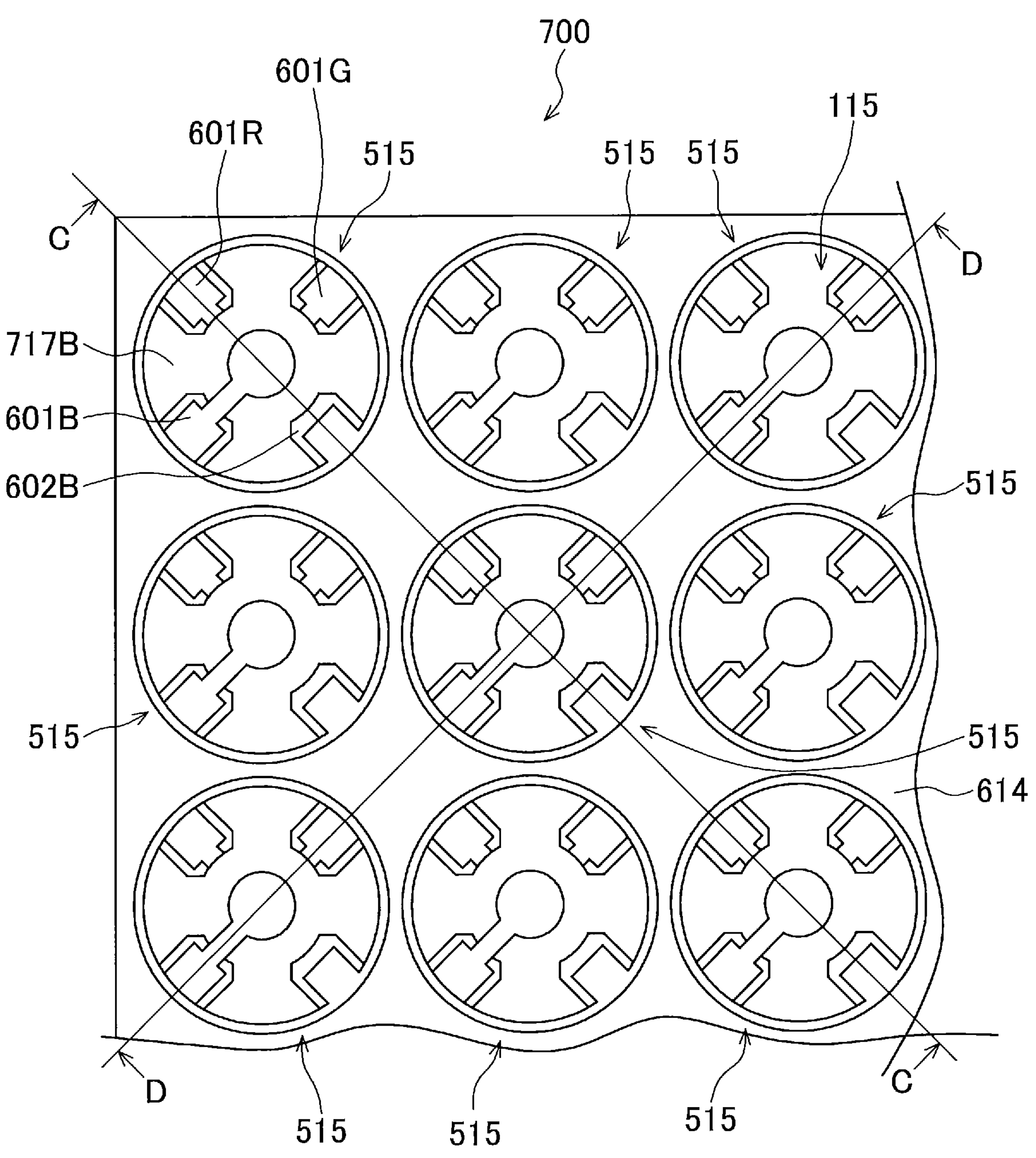
FIG. 12 is an enlarged plan view illustrating a part of a semiconductor device according to a modification of the third embodiment.
Figure 13:
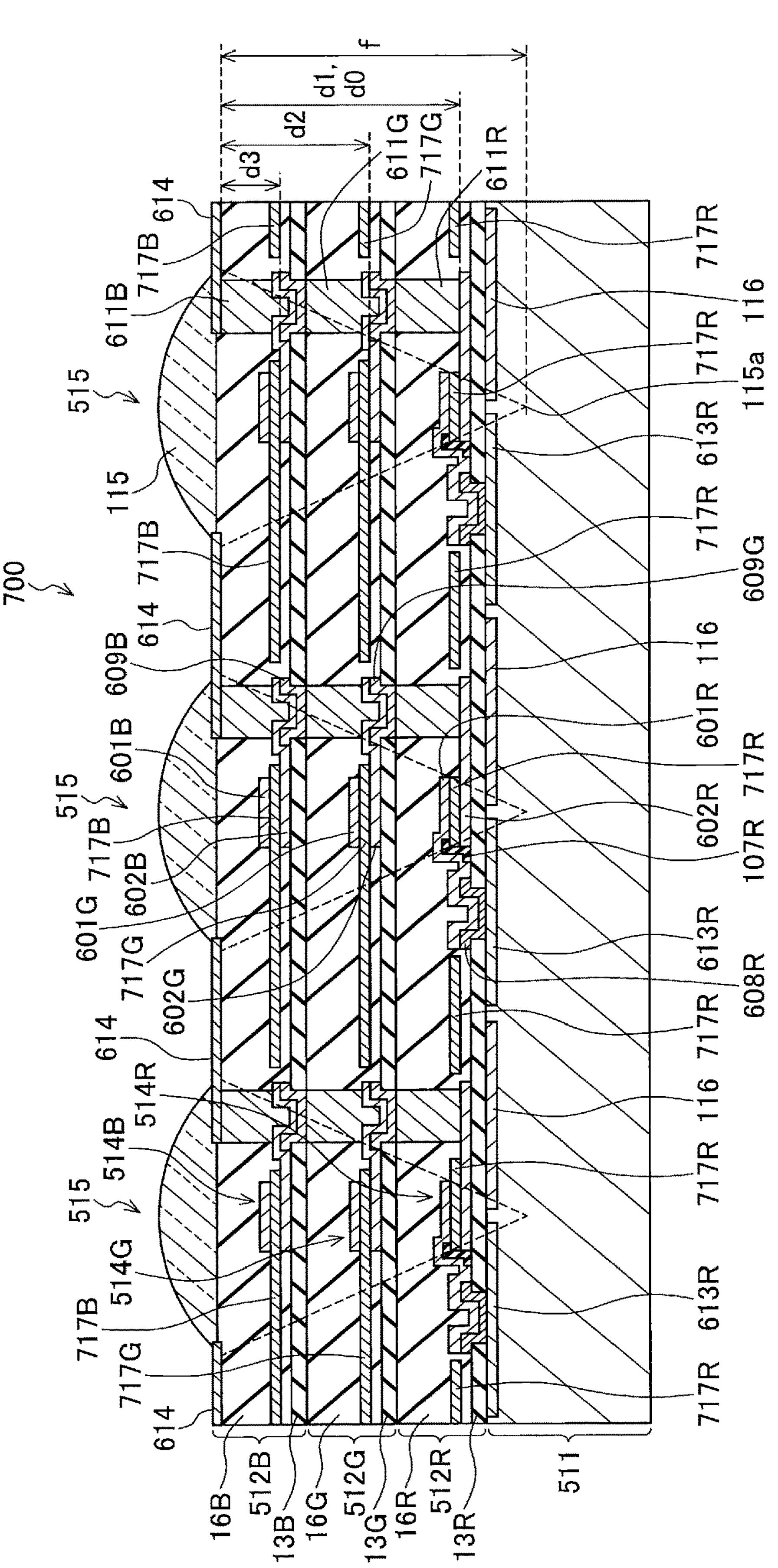
FIG. 13 is a cross-sectional view taken along line C-C of FIG. 12.
Figure 14:
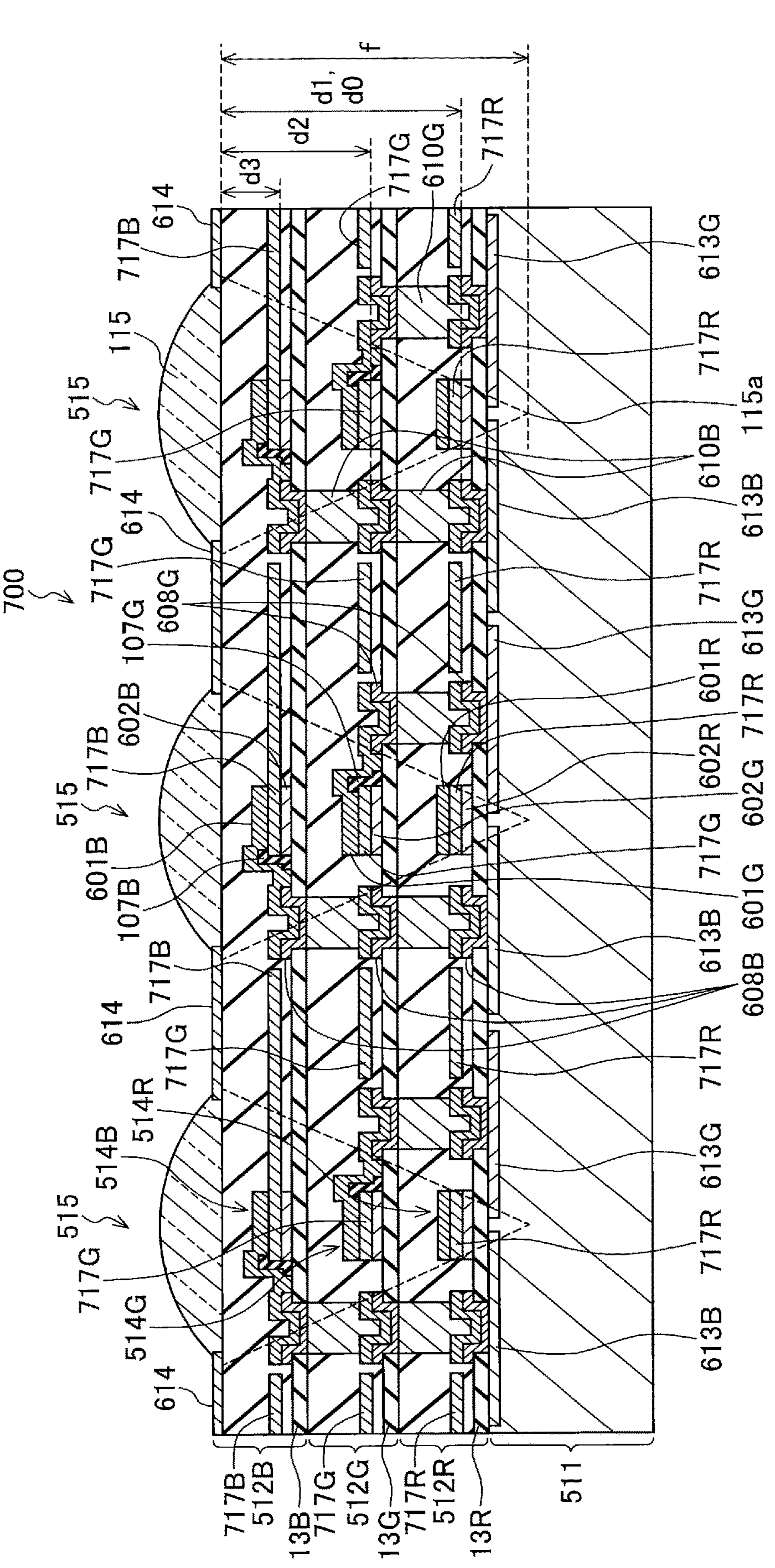
FIG. 14 is a cross-sectional view taken along line D-D of FIG. 12.

FIG. 12 is an enlarged plan view illustrating a part of a semiconductor device 700 according to a modification of the third embodiment of the present disclosure. FIG. 13 is a cross-sectional view taken along line C-C of FIG. 12. FIG. 14 is a cross-sectional view taken along line D-D of FIG. 12.

Parts of the semiconductor device 700 of this modification that are the same as those of the semiconductor device 500 of the third embodiment are given the same reference characters, and illustration and description thereof may be omitted. The configuration of the semiconductor device 700 of this modification is different from that of the semiconductor device 500 of the third embodiment illustrated in FIGS. 9, 10, and 11 mainly in that the light receiving elements 514R, 514G, and 514B include, instead of the photoelectric conversion elements 617R, 617G, and 617B, photoelectric conversion elements 717R, 717G, and 717B wider than the photoelectric conversion elements 617R, 617G, and 617B. The following description focuses on the differences from the third embodiment.

As illustrated in FIGS. 9 to 11, in the semiconductor device 500 of the third embodiment, each photoelectric conversion element 617 is formed within the region sandwiched between the individual electrode 601 and the common electrode 602. On the other hand, in the semiconductor device 700 of this modification, as illustrated in FIGS. 12 to 14, each photoelectric conversion element 717 is formed to extend beyond the region sandwiched between the individual electrode 601 and the common electrode 602.

This modification does not require the photoelectric conversion elements 717 to be fitted to the individual electrodes 601 and common electrodes 602, facilitating the manufacturing process.

In this embodiment, the individual electrode selection circuit substrate 511, red layer 512R, green layer 512G, and blue layer 512B are stacked in this order from bottom to top. However, this is not mandatory, and they may be stacked in the order of the individual electrode selection circuit substrate 511, red layer 512R, blue layer 512B, and green layer 512G from bottom to top, or may be stacked in the order of the individual electrode selection circuit substrate 511, blue layer 512B, red layer 512R, and green layer 512G from bottom to top as with the second embodiment.

As above, the semiconductor device 500 of this embodiment can compensate for the low photoelectric conversion efficiency of the light receiving element 514 having the lowest photoelectric conversion efficiency of the stacked multiple light receiving elements 514 having different photoelectric conversion efficiencies, with the light collection efficiency of the microlens 115, compensating for the differences between the photoelectric conversion efficiencies of the light receiving elements 514 of the respective colors and equalizing the conversion efficiencies of the respective colors. The same applies to the semiconductor device 700.

As above, in a semiconductor device in which multiple layers (or films) including optical semiconductor elements are stacked, by disposing a lens on the stacked layers, it is possible to improve the performance of the semiconductor device. For example, it is possible to provide the semiconductor device with desired color characteristics by using the single lens. Since the optical semiconductor elements are located at different distances from the lens, the light collection efficiency of the lens varies between the optical semiconductor elements. According to the present disclosure, the light collection efficiency of the lens can compensate for the difference between the conversion efficiencies of the optical semiconductor elements, thus providing the semiconductor device with desired color characteristics.

Although terms, such as "upper", "lower", "above", "below", "top", and "bottom", indicating the upward and downward directions are used in the above description of the embodiments, they are used for convenience and not intended to limit the absolute positional relationship in the state in which the semiconductor device is placed.

Although the above embodiments each describe a semiconductor device of the present disclosure as a microdisplay or an imaging device, techniques of the present disclosure are applicable to other devices such as video equipment, cameras, and video cameras.

What is claimed is:

1. A semiconductor device comprising:

a first layer including a plurality of first optical semiconductor elements and a first insulating member covering the plurality of first optical semiconductor elements;

a second layer including a plurality of second optical semiconductor elements and a second insulating member covering the plurality of second optical semiconductor elements; and a plurality of lens members each having an optical axis and a focal point, wherein the plurality of first optical semiconductor elements, the plurality of second optical semiconductor elements and the plurality of lens members correspond respectively to one another, to thereby form a plurality of light emitting units, and in each of the plurality of light emitting units, with "a first optical semiconductor element of the plurality of first optical semiconductor elements and a second optical semiconductor element of the plurality of second optical semiconductor elements are arranged on an optical axis of a lens member of the plurality of lens members and the first optical semiconductor element and the second optical semiconductor element are disposed between the lens member and the focal point of the lens member in a direction of the optical axis, at least partially overlap each other as viewed in the direction of the optical axis, and are disposed so that the second optical semiconductor element is closer to the focal point than the first optical semiconductor element.

2. The semiconductor device of claim 1, further comprising:

a third layer including a plurality of third optical semiconductor elements, respectively included in the plurality of light emitting units; and a control substrate configured to control the plurality of first optical semiconductor elements, the plurality of second optical semiconductor elements, and the plurality of third optical semiconductor elements, wherein the second layer is disposed on the control substrate, the first layer is disposed on the second layer, the third layer is disposed on the first layer, and the plurality of lens members are disposed on the third layer.

3. The semiconductor device of claim 2, wherein the plurality of focal points are located in the control substrate.

4. The semiconductor device of claim 1, further comprising:

a third layer including a plurality of third optical semiconductor elements, respectively included in the plurality of light emitting units;

a control substrate configured to control the plurality of first optical semiconductor elements, the plurality of second optical semiconductor elements, and the plurality of third optical semiconductor elements, wherein the third layer is disposed on the control substrate, the second layer is disposed on the third layer, the first layer is disposed on the second layer, and the plurality of lens members are disposed on the first layer.

5. The semiconductor device of claim 1, wherein each of the plurality of first optical semiconductor elements and the plurality of second optical semiconductor elements includes a light emitting layer, and in each of the plurality of light emitting units, the light emitting layers of the first optical semiconductor element and the second optical semiconductor element are disposed in a circular cone defined by an outer circumference of the lens member and the focal point thereof.

6. The semiconductor device of claim 5, wherein each of the plurality of first optical semiconductor elements is a first light emitting element emitting first light, and each of the plurality of second optical semiconductor elements is a second light emitting element emitting second light, which has a longer wavelength than the first light.

7. The semiconductor device of claim 1, wherein each of the plurality of first optical semiconductor elements and the plurality of second optical semiconductor elements includes a photoelectric conversion element, and in each of the plurality of light emitting units, the photoelectric conversion elements of the first optical semiconductor element and the second optical semiconductor element are disposed in a circular cone defined by an outer circumference of the lens member and the focal point thereof.

8. The semiconductor device of claim 7, wherein each of the plurality of first optical semiconductor elements is a first light receiving element configured to detect first light, each of the plurality of e second optical semiconductor elements is a second light receiving element configured to detect second light, which has a longer wavelength than the first light.

9. The semiconductor device of claim 1, wherein the plurality of the light emitting units are arranged adjacent to each other along a plane perpendicular to the direction of each of the optical axes.

* * * * *